United States Patent
Kim et al.

(10) Patent No.: US 9,685,948 B2
(45) Date of Patent: Jun. 20, 2017

(54) GATE DRIVING CIRCUIT, DRIVING METHOD FOR GATE DRIVING CIRCUIT AND DISPLAY PANEL USING THE SAME

(71) Applicant: Samsung Display Co., Ltd., Yongin, Gyeonggi-Do (KR)

(72) Inventors: Jong Hee Kim, Hwaseong-si (KR); Hyun Joon Kim, Yongin-si (KR); Kyoung Ju Shin, Hwaseong-si (KR); Alexander Ward, Yongin-si (KR); Cheol-Gon Lee, Seoul (KR); Chong Chul Chai, Seoul (KR)

(73) Assignee: Samsung Display Co., LTD. (KR)

( * ) Notice: Subject to any disclaimer, the term of this patent is extended or adjusted under 35 U.S.C. 154(b) by 0 days.

(21) Appl. No.: 14/456,926

(22) Filed: Aug. 11, 2014

(65) Prior Publication Data
US 2015/0287392 A1   Oct. 8, 2015

(30) Foreign Application Priority Data

Apr. 2, 2014   (KR) .................. 10-2014-0039531

(51) Int. Cl.
*G09G 3/36* (2006.01)
*H03K 17/693* (2006.01)

(52) U.S. Cl.
CPC ......... *H03K 17/693* (2013.01); *G09G 3/3677* (2013.01); *G09G 2310/0286* (2013.01); *G09G 2310/06* (2013.01)

(58) Field of Classification Search
CPC ..................................... G09G 3/3677

USPC .................................................... 345/98, 100
See application file for complete search history.

(56) References Cited

U.S. PATENT DOCUMENTS

| | | | | |
|---|---|---|---|---|
| 6,845,140 B2 * | 1/2005 | Moon | .................. | G09G 3/3685 345/100 |
| 7,724,864 B2 * | 5/2010 | Kim | ...................... | G11C 19/184 377/64 |
| 7,936,331 B2 * | 5/2011 | Uh | ......................... | G11C 19/28 345/100 |

(Continued)

FOREIGN PATENT DOCUMENTS

| | | |
|---|---|---|
| CN | 103714789 A | 4/2014 |
| EP | 2713361 A1 | 4/2014 |

(Continued)

*Primary Examiner* — Kwang-Su Yang
(74) *Attorney, Agent, or Firm* — Innovation Counsel LLP

(57) ABSTRACT

A stage includes a first transistor including an input terminal to which a clock signal is applied and a control terminal connected to a first node; a first capacitor including terminals respectively connected to the first node and an output terminal of the first transistor; a second transistor including an input terminal connected to the output terminal of the first transistor, a control terminal connected to a second node, and an output terminal to which a low voltage is applied; a third transistor including an output terminal connected to the second node, a control terminal connected to the first node, and an input terminal to which the low voltage is applied; and a fourth transistor including an input terminal connected to the first node and an output terminal to which the low voltage is applied, wherein the fourth transistor is switched according to an output signal of a next stage.

12 Claims, 6 Drawing Sheets

(56) References Cited

U.S. PATENT DOCUMENTS

| | | | |
|---|---|---|---|
| 8,462,097 B2 * | 6/2013 | Kim | G09G 3/3677 |
| | | | 345/100 |
| 8,654,055 B2 * | 2/2014 | Kim | H03K 19/00361 |
| | | | 345/100 |
| 9,159,448 B2 * | 10/2015 | Shao | G11C 19/28 |
| 2008/0088555 A1 * | 4/2008 | Shin | G09G 3/3677 |
| | | | 345/87 |
| 2014/0092078 A1 | 4/2014 | Yoon et al. | |
| 2015/0042547 A1 | 2/2015 | Kwon et al. | |

FOREIGN PATENT DOCUMENTS

| | | | | |
|---|---|---|---|---|
| JP | 2014-071452 A | | 4/2014 | |
| KR | 10-2007-0077680 A | | 7/2007 | |
| KR | 1020070077680 A | * | 9/2007 | ........... G09G 3/3677 |
| KR | 10-08386490000 B1 | | 6/2008 | |
| KR | 10-09105620000 B1 | | 8/2009 | |
| KR | 10-09738210000 B1 | | 8/2010 | |
| KR | 10-2014-0042308 A | | 4/2014 | |

\* cited by examiner

GATE DRIVING CIRCUIT, DRIVING METHOD FOR GATE DRIVING CIRCUIT AND DISPLAY PANEL USING THE SAME

CROSS-REFERENCE TO RELATED APPLICATION

This application claims priority to and the benefit of Korean Patent Application No. 10-2014-0039531 filed in the Korean Intellectual Property Office on Apr. 2, 2014, the entire contents of which are incorporated herein by reference.

BACKGROUND (a) Field

The present disclosure relates to a gate driving circuit, a driving method of the gate driving circuit, and a display device including the same. More particularly, the present disclosure relates to a display device having an integrated gate driver.

(b) Description of the Related Art

Display devices that are currently on the market generally include organic light emitting devices, plasma display devices, electrophoretic displays, and liquid crystal displays.

The liquid crystal display is widely used in display devices. The liquid crystal display has two display panels on which field generating electrodes (such as pixel electrodes and a common electrode) are formed, and a liquid crystal layer interposed between the display panels. In the liquid crystal display, a voltage is applied to the field generating electrodes to form an electric field in the liquid crystal layer. The electric field determines the alignment of liquid crystal molecules in the liquid crystal layer and controls the polarization of incident light through the liquid crystal layer, thereby displaying images.

A gate driver and a data driver are usually included in the display device. The gate driver may be patterned along with gate lines, data lines, and thin film transistors. Accordingly, the gate driver may be integrated into the display device. Since the integrated gate driver does not require an additional gate driving chip, manufacturing costs may be reduced.

However, to improve the reliability of the driving circuit of a large-sized display device and to reduce leakage current, a large number of transistors may be required. As such, the area of the driving circuit may increase. Also, the manufacturing yield may deteriorate since a large number of transistors are fabricated.

SUMMARY

The present disclosure addresses at least the above challenges relating to the area of the driving circuit and the manufacturing yield of a display device.

According to an exemplary embodiment of the inventive concept, a gate driving circuit includes a plurality of stages configured to output a gate signal to a corresponding gate line, wherein one of the plurality of stages includes: a first transistor including an input terminal to which a clock signal is applied and a control terminal connected to a first node; a first capacitor including a terminal connected to the first node and another terminal connected to an output terminal of the first transistor; a second transistor including an input terminal connected to the output terminal of the first transistor, a control terminal connected to a second node, and an output terminal to which a low voltage is applied; a third transistor including an output terminal connected to the second node, a control terminal connected to the first node, and an input terminal to which the low voltage is applied; and a fourth transistor including an input terminal connected to the first node and an output terminal to which the low voltage is applied, and wherein the fourth transistor is switched according to an output signal of a next stage.

In some embodiments, the gate driving circuit may further include a fifth transistor wherein an input terminal and a control terminal of the fifth transistor are connected and applied with an output signal of a previous stage or a scan start signal, wherein an output terminal of the fifth transistor is connected to the first node, and wherein the fifth transistor is diode-connected according to the output signal of the previous stage or the scan start signal.

In some embodiments, the first capacitor may be precharged by the output signal of the previous stage or the scan start signal.

In some embodiments, the first capacitor may be boosted up by a high level of the clock signal.

In some embodiments, the gate driving circuit may further include a sixth transistor including an input terminal connected to the first node, a control terminal connected to the second node, and an output terminal to which the low voltage is applied, and wherein the sixth transistor is switched according to a voltage of the second node.

In some embodiments, the gate driving circuit may further include a seventh transistor including an input terminal and a control terminal to which the clock signal is applied, and an output terminal connected to the second node, and wherein the seventh transistor is diode-connected according to the clock signal.

In some embodiments, the gate driving circuit may further include an eighth transistor including an input terminal connected to the output terminal of the first transistor, a control terminal connected to the control terminal of the fourth transistor, and an output terminal to which the low voltage is applied, and wherein the eighth transistor is switched according to the output signal of the next stage.

In some embodiments, the gate driving circuit may further include a ninth transistor including an input terminal and a control terminal to which the clock signal is applied, and an output terminal connected to the input terminal of the seventh transistor, and wherein the ninth transistor is diode-connected according to the clock signal.

In some embodiments, the gate driving circuit may further include a second capacitor including a terminal connected to an input terminal of the first transistor and another terminal connected to the second node.

According to another exemplary embodiment of the inventive concept, a method for driving a gate driving circuit comprising a plurality of stages configured to output a gate signal to a corresponding gate line is provided. The method includes applying, to a first node, an output signal of a previous stage from among the plurality of stages or a scan start signal; boosting up a first capacitor by a high level of a clock signal, wherein the first capacitor includes a terminal connected to the first node; generating an output signal corresponding to a voltage of the first node to the output terminal of a current stage; and changing the first node and the output signal to a low level by the output signal of a next stage.

In some embodiments, applying, to the first node, the output signal of the previous stage from among the plurality of stages or the scan start signal may further include precharging the first capacitor through the output signal of the previous stage or the scan start signal.

In some embodiments, the driving method of the gate driving circuit may further include applying the high level of the clock signal to a second node; applying a voltage of the boosted-up capacitor to the first node so as to form a path between the second node and a low voltage; and changing a voltage of the second node to the low voltage using the path.

According to a further exemplary embodiment of the inventive concept, a display device includes a display unit including a plurality of gate lines and a gate driver, wherein the gate driver includes a plurality of stages configured to output a gate signal to a corresponding gate line from among the plurality of gate lines, wherein the gate driver further includes: a first transistor including an input terminal to which a clock signal is applied and a control terminal connected to a first node; a first capacitor including a terminal connected to the first node and another terminal connected to an output terminal of the first transistor; a second transistor including an input terminal connected to the output terminal of the first transistor, a control terminal connected to a second node, and an output terminal to which a low voltage is applied; a third transistor including an output terminal connected to the second node, a control terminal connected to the first node, and an input terminal to which the low voltage is applied; and a fourth transistor including an input terminal connected to the first node and an output terminal to which the low voltage is applied, and wherein the fourth transistor is switched according to an output signal of a next stage.

In some embodiments, the display device may further include a fifth transistor wherein an input terminal and a control terminal of the fifth transistor are connected and applied with an output signal of a previous stage or a scan start signal, wherein an output terminal of the fifth transistor is connected to the first node, and wherein the fifth transistor is diode-connected according to the output signal of the previous stage or the scan start signal.

In some embodiments, the first capacitor may be precharged by the output signal of the previous stage or the scan start signal.

In some embodiments, the first capacitor may be boosted up by a high level of the clock signal.

In some embodiments, the display device may further include a sixth transistor including an input terminal connected to the first node, a control terminal connected to the second node, and an output terminal to which the low voltage is applied, and wherein the sixth transistor is switched according to a voltage of the second node.

In some embodiments, the display device may further include a seventh transistor including an input terminal and a control terminal to which the clock signal is applied, and an output terminal connected to the second node, and wherein the seventh transistor is diode-connected according to the clock signal.

In some embodiments, the display device may further include an eighth transistor including an input terminal connected to the output terminal of the first transistor, a control terminal connected to the control terminal of the fourth transistor, and an output terminal to which the low voltage is applied, and wherein the eighth transistor is switched according to the output signal of the next stage.

In some embodiments, the display device may further include a ninth transistor including an input terminal and a control terminal to which the clock signal is applied, and an output terminal connected to the input terminal of the seventh transistor, and wherein the ninth transistor is diode-connected according to the clock signal; and a second capacitor including a terminal connected to an input terminal of the first transistor and another terminal connected to the second node.

Accordingly, the area of the gate driving circuit can be reduced and the manufacturing yield improved using the aforementioned gate driving circuit, driving method of the gate driving circuit, and display device including the gate driving circuit according to the different exemplary embodiments of the inventive concept.

DETAILED DESCRIPTION

Figure 1:
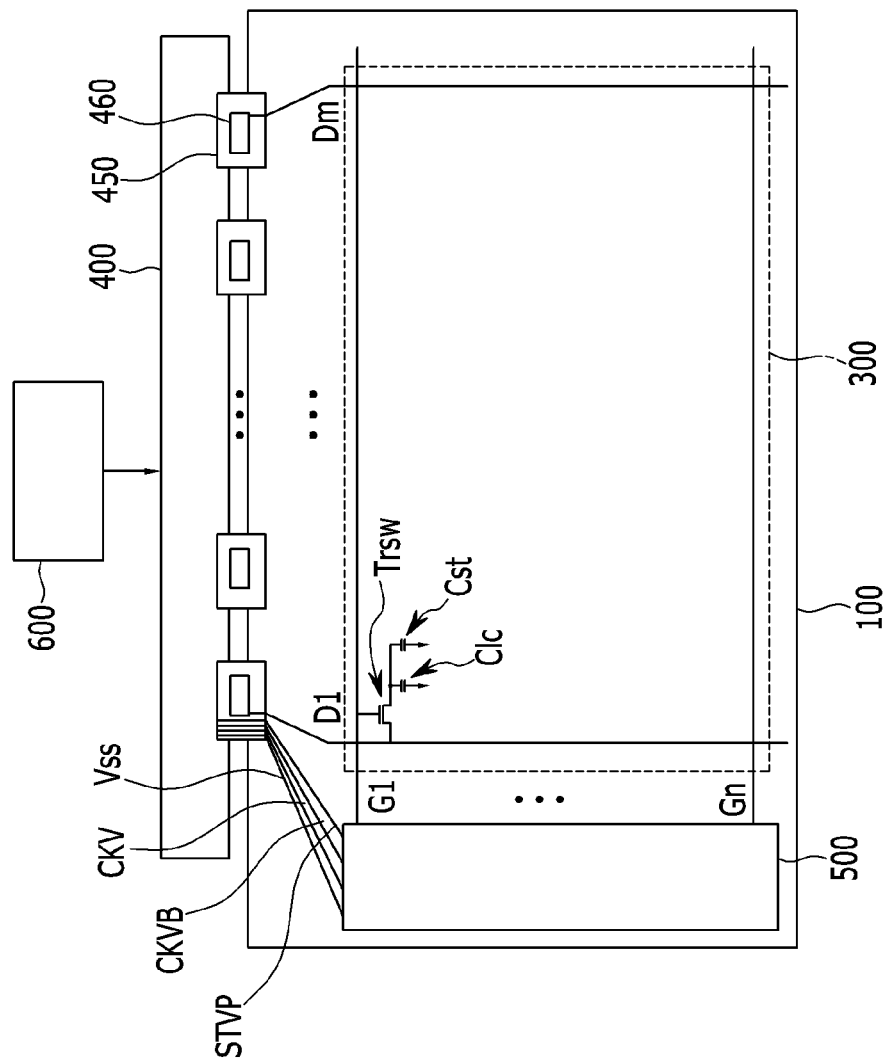
FIG. 1 is a top plan view of a display device according to an exemplary embodiment of the inventive concept.

The inventive concept will be described more fully herein with reference to the accompanying drawings, in which exemplary embodiments are shown. As those skilled in the art would realize, the described embodiments may be modified in various ways without departing from the spirit or scope of the inventive concept. The drawings and description are to be regarded as illustrative in nature and not restrictive. Like reference numerals designate like elements throughout the specification. Throughout the specification, unless explicitly described to the contrary, the word "comprise" and variations such as "comprises" or "comprising" will be understood to imply the inclusion of stated elements but not the exclusion of any other elements. In addition, the terms "-er", "-or" and "module" described in the specification refer to units for processing at least one function and operation and can be implemented by hardware components or software components and combinations thereof.

First, a display device according to an exemplary embodiment of the inventive concept will be described with reference to FIG. 1. Specifically, FIG. 1 is a top plan view of a display device 100 according to an exemplary embodiment.

Referring to FIG. 1, the display device 100 includes a display unit 300 configured to display an image and a gate driver 500 configured to apply a gate voltage to the gate lines G1-Gn of the display unit 300. The data lines D1 to Dm of the display unit 300 receive a data voltage from a data driver IC 460. The data driver IC 460 is formed on a film (such as a flexible printed circuit film (FPC) 450) attached to the display device 100. The gate driver 500 and the data driver IC 460 are controlled by a signal controller 600.

In the embodiment of FIG. 1, the flexible printed circuit film 450 is electrically connected to a printed circuit board (PCB) 400, and a signal from the signal controller 600 is transmitted to the data driver IC 460 and the gate driver 500 through the printed circuit board (PCB) 400 and the flexible printed circuit film 450. However, the inventive concept is not limited to the above embodiment, and it should be appreciated that the signal transmission may be achieved using different hardware and configurations.

In the example of FIG. 1, a liquid crystal display is used as the display unit 300. In some other embodiments, the display unit 300 may include an organic light emitting device including a thin film transistor, an organic light emitting diode, or the like, or other types of display devices (e.g. plasma display devices, electrophoretic displays) including elements such as thin film transistors.

The display unit 300 includes a plurality of gate lines G1-Gn and a plurality of data lines D1-Dm formed crossing the gate lines G1-Gn. The plurality of gate lines G1-Gn and data lines D1-Dm are insulated from each other. The display unit 300 includes a plurality of pixels PX. Each pixel PX includes a thin film transistor TRsw, a liquid crystal capacitor Clc, and a storage capacitor Cst. The thin film transistor TRsw includes a control terminal connected to a gate line, an input terminal connected to a data line, and an output terminal connected to a first terminal of the liquid crystal capacitor Clc and a first terminal of the storage capacitor Cst. A second terminal of the liquid crystal capacitor Clc is connected to the common electrode, and a second terminal of the storage capacitor Cst receives a storage voltage Vcst applied from the signal controller 600. The pixel PX of the liquid crystal display may have different structural embodiments. For example, those skilled in the art would appreciate that additional elements may be added to the structure of the pixel PX shown in FIG. 1.

The plurality of data lines D1-Dm receive the data voltage from the data driver IC 460, and the plurality of gate lines G1-Gn receive the gate voltage from the gate driver 500. The data driver IC 460 is connected to the data lines D1-Dm that are formed at an upper or lower side of the display device 100 and that extend in a longitudinal direction, as shown in FIG. 1. The data driver IC 460 is positioned at the lower side of the display device 100. The gate driver 500 receives the clock signals CKV and CKVB, the scan start signal STVP, and the low voltage Vss corresponding to the gate-off voltage so as to generate the gate voltage (the gate-on voltage and the gate-off voltage), and sequentially applies the gate-on voltage to the gate lines G1-Gn.

As shown in FIG. 1, the clock signals CKV and CKVB, the scan start signal STVP, and the low voltage Vss are applied to the gate driver 500 through the flexible printed circuit film 450 (from among the plurality of flexible printed circuit films 450) that is closest to the gate driver 500. These signals are transmitted to the flexible printed circuit film 450 through the printed circuit board (PCB) 400 from the outside (e.g. from the signal controller 600).

Figure 2:
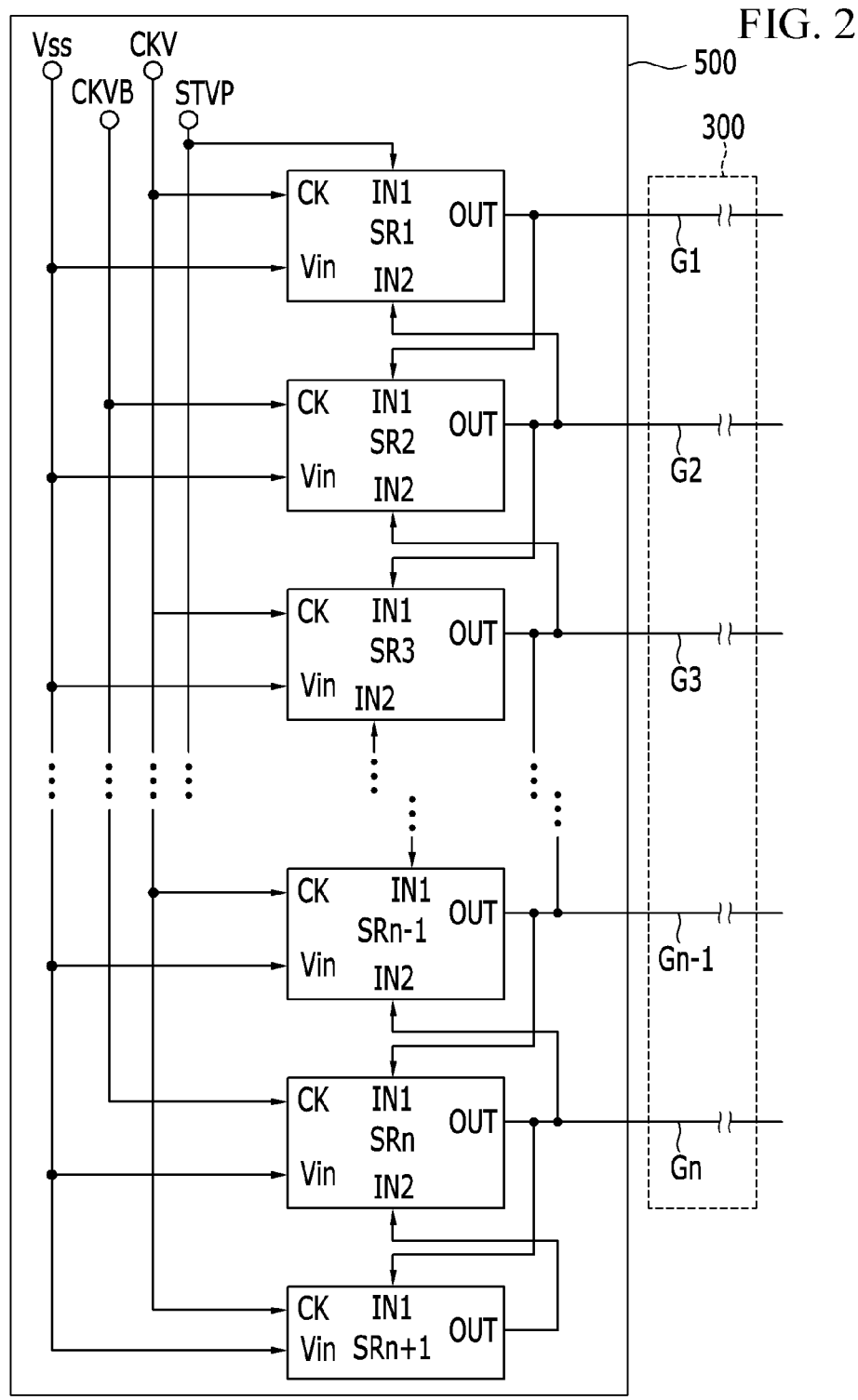
FIG. 2 is a block diagram of a gate driver and a gate line according to an exemplary embodiment.

FIG. 2 is a block diagram of a gate driver and a gate line according to an exemplary embodiment. The gate driver 500 may include a plurality of stages SR1, SR2, SR3, . . . SRn−1, SRn. Each stage SR1, SR2, SR3, . . . SRn−1, SRn includes two input terminals IN1 and IN2, a clock input terminal CK, a voltage input terminal Vin, and an output terminal OUT. The first input terminal IN1 of each stage is connected to the stage output terminal OUT of the previous stage so as to receive the output signal of the previous stage. However, the first stage SR1 does not have a previous stage. As such, the scan start signal STVP is applied to the first input terminal IN1 of the first stage SR1. The second input terminal IN2 of each stage is connected to the output terminal OUT of the next stage so as to receive the output signal of the next stage.

A dummy stage SR(n+1) may be formed such that the stage SRn connected to the n-th gate line Gn may receive the output signal from the dummy stage. The dummy stage is configured to generate and output a dummy gate voltage that is different from the voltages output by the other stages SR1-SRn. When the gate voltage output from the stages SR1-SRn is transmitted through the gate lines G1 to Gn, the data voltage is applied to the pixel, thereby displaying the image. However, the dummy stage SR(n+1) is not connected to the gate lines G1 to Gn. Instead, the dummy stage SR(n+1) is connected to a gate line (not shown) of a dummy pixel (not shown) in which the image is not displayed. Accordingly, the dummy stage SR(n+1) is not used to display the image.

The clock signals CKV and CKVB are applied to the clock input terminal CK. Specifically, the first clock signal CKV is applied to the clock input terminal CK of the odd numbered stages, and the second clock signal CKVB is applied to the clock input terminal CK of the even numbered stage, from among the plurality of stages SR1 to SR(n+1). The first clock signal CKV and the second clock signal CKVB are clock signals having opposite phases.

The voltage input terminal Vin is applied with the low voltage Vss corresponding to the gate-off voltage. The low voltage Vss may have various voltage values in different embodiments.

Next, the operation of the gate driver 500 will be described. First, the first stage SR1 receives the first clock signal CKV provided from the outside through the clock input terminal CK, the scan start signal STVP through the input terminal IN1, the low voltage Vss through the voltage input terminal Vin, and the output signal Gout[2] provided from the second stage SR2 through the second input terminal IN2.

The second stage SR2 receives the second clock signal CKVB provided from the outside through the clock input terminal CK, the output signal Gout[1] of the first stage SR1 through the first input terminal IN1, the low voltage Vss through the voltage input terminal Vin, and the output signal Gout[3] provided from the third stage SR3 through the second input terminal IN2.

The third stage SR3 receives the first clock signal CKV provided from the outside through the clock input terminal CK, the output signal Gout[2] of the second stage SR2 through the first input terminal IN1, the low voltage Vss through the voltage input terminal Vin, and the output signal Gout[4] provided from the fourth stage SR4 through the second input terminal IN2.

Accordingly, the (n−1)-th stage SR(n−1) receives the first clock signal CKV provided from the outside through the clock input terminal CK, the output signal Gout[n−2] of the (n−2)-th stage SR(n−2) through the first input terminal IN1, the low voltage Vss through the voltage input terminal Vin, and the output signal Gout[n] provided from the n-th stage SRn through the second input terminal IN2.

Similarly, the n-th stage SRn receives the second clock signal CKVB provided from the outside through the clock input terminal CK, the output signal Gout[n−1] of the (n−1)-th stage SR(n−1) through the first input terminal IN1, the low voltage Vss through the voltage input terminal Vin, and the output signal Gout[n+1] provided from the dummy stage SR(n+1) through the second input terminal IN2.

Figure 3:
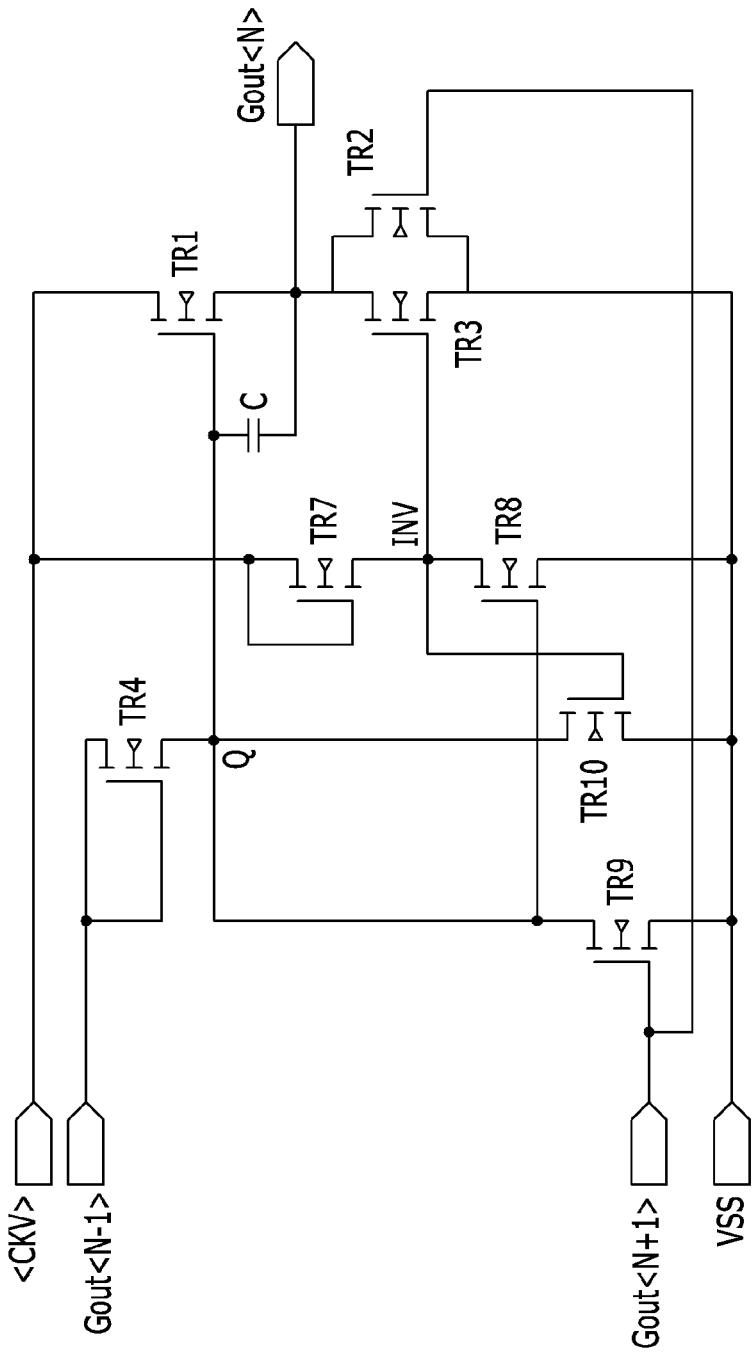
FIG. 3 is a circuit diagram of a stage in a gate driver according to a first exemplary embodiment of the inventive concept.

Next, the structure of a stage of a gate driver connected to a gate line will be described with reference to FIG. 3. FIG. 3 is a circuit diagram of the stage in the gate driver according to a first exemplary embodiment of the inventive concept.

Referring to FIG. 3, a stage SRn includes a first transistor TR1, a second transistor TR2, a third transistor TR3, a fourth transistor TR4, a seventh transistor TR7, an eighth transistor TR8, a ninth transistor TR9, a tenth transistor TR10, and a capacitor C. The input terminal and the control terminal of the fourth transistor TR4 are commonly connected (via a diode connection) to the output terminal Gout<n−1> of the previous stage SR(n−1), and the output terminal of the fourth transistor TR4 is connected to a Q node.

The input terminal and the control terminal of the seventh transistor TR7 are commonly connected (via a diode connection) to the clock input terminal CK such that the first clock signal CKV or the second clock signal CKVB can be applied through the clock input terminal CK. The output terminal of the seventh transistor TR7 is connected to an INV node.

The eighth transistor TR8 includes the output terminal connected to the INV node, the control terminal connected to the Q node, and the input terminal connected to the voltage input terminal Vss.

The first transistor TR1 includes the control terminal connected to the Q node, and the input terminal connected to the clock input terminal CK such that the first clock signal CKV or the second clock signal CKVB can be applied through the clock input terminal CK. The output terminal of the first transistor TR1 is connected to the output terminal Gout<n> of the current stage SRn.

The third transistor TR3 includes the control terminal connected to the INV node and the input terminal connected to the output terminal Gout<n> of the current stage SRn. The third transistor TR3 changes the voltage of the output terminal Gout<n> of the current stage SRn to the low voltage Vss according to the voltage of the INV node.

The tenth transistor TR10 includes the input terminal connected to the Q node, the output terminal connected to the voltage input terminal VSS, and the control terminal connected to the INV node. The tenth transistor TR10 changes the voltage of the Q node to the low voltage Vss according to the voltage of the INV node.

The second transistor TR2 includes the control terminal connected to the output terminal Gout<n+1> of the next stage SR(n+1) and the input terminal connected to the output terminal Gout<n> of the current stage SRn. The output terminal of the second transistor TR2 is connected to the voltage input terminal VSS. The second transistor TR2 changes the voltage of the output terminal Gout<n> of the current stage SRn to the low voltage Vss according to the output signal Gout[N+1] of the next stage SR(n+1).

The ninth transistor TR9 includes the control terminal connected to the output terminal Gout<n+1> of the next stage SR(n+1) and the input terminal connected to the Q node. The output terminal of the ninth transistor TR9 is connected to the voltage input terminal VSS. The ninth transistor TR9 changes the voltage of the Q node to the low voltage Vss according to the output signal Gout<n+1> of the next stage SR(n+1).

The capacitor C is connected between the Q node and the output terminal Gout<n> of the current stage SRn.

Figure 4:
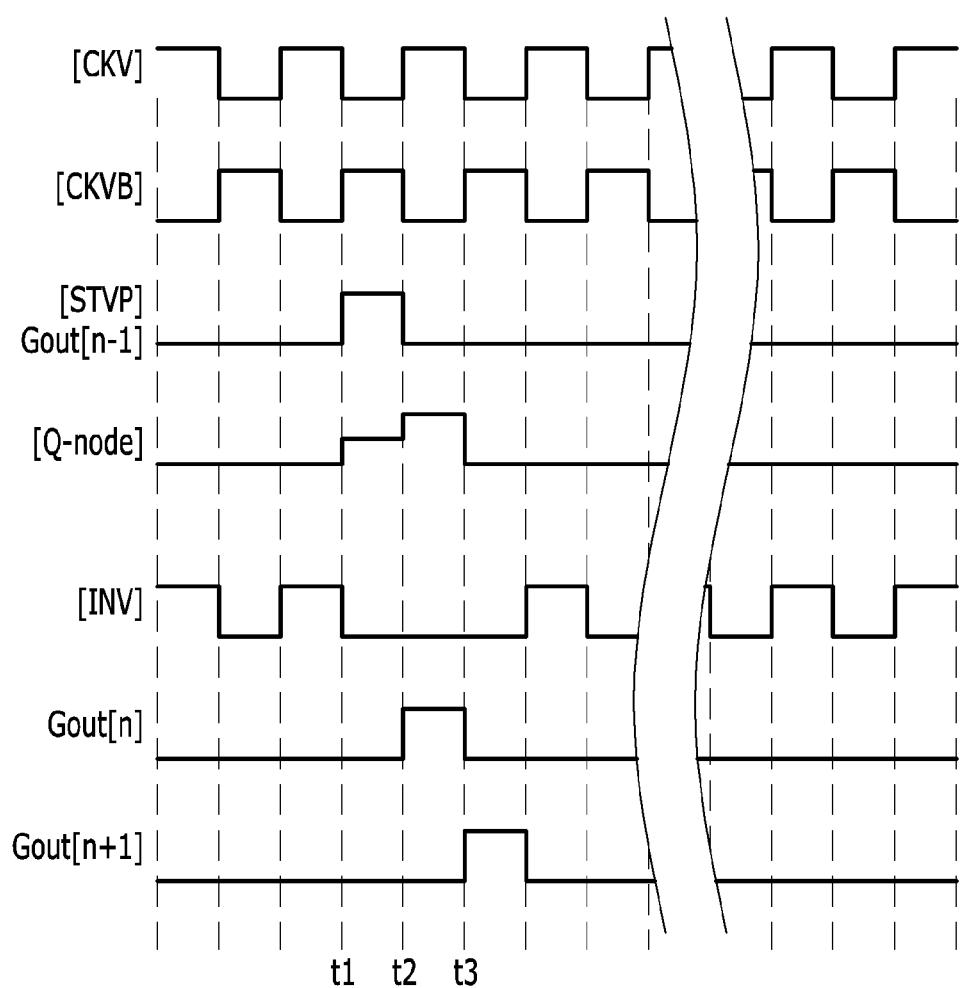
FIG. 4 is a timing diagram of an operation of a gate driver according to the first exemplary embodiment.

Next, the operation of the gate driver 500 according to the first exemplary embodiment of the inventive concept will be described with reference to FIG. 4. FIG. 4 is a timing diagram showing the operation of a gate driver according to the first exemplary embodiment.

Referring to FIG. 4, at time t1, a high level start signal STVP (or a high level output signal Gout(n−1) of the previous stage SR(n−1)) is input to the first input terminal IN1. Thus, the diode-connected fourth transistor TR4 is turned on such that the high level voltage is applied to the Q node. A voltage difference is generated between the control terminal and the output terminal of the first transistor TR1 by the voltage of the Q node, and this voltage difference is stored in the capacitor C such that the capacitor C is precharged.

At time t2, the first clock signal CKV of the high level is input through the clock input terminal CK. First, the high level output signal Gout[n] of the current stage SRn is output to the output terminal OUT through the transistor TR1 and the voltage charged to the capacitor C is boosted up by the output signal of the high level. The transistor TR7 is turned on such that the first clock signal CKV of the high level is applied to the INV node, and the boosted-up voltage is applied to the Q node by the boosted-up capacitor C. The boosted-up voltage is applied to the control terminal of the eighth transistor TR8 such that the eighth transistor TR8 is turned on. A path is formed between the INV node and the low voltage Vss by the turned-on eighth transistor TR8, and the high level voltage applied to the INV node is decreased to the low voltage Vss by the path. Accordingly, the INV node has a lower voltage level than the first clock signal CKV and the output signal Gout of the current stage SRn.

At time t3, the high level output signal Gout[n+1] of the next stage SR(n+1) is applied to the second input terminal IN2. The second transistor TR2 and the ninth transistor TR9 are turned on by the output signal Gout[n+1]. First, the voltage of the output signal Gout[n] of the current stage SRn is changed to the low voltage Vss through the second transistor TR2. The voltage of the Q node of the current stage SRn is changed to the low voltage Vss through the ninth transistor TR9.

The operation of the gate driver 500 according to the first exemplary embodiment at times t1 to t3 has been described above using the first clock signal CKV as an example. However, the inventive concept is not limited thereto. For example, the first clock signal CKV may be applied to the clock input terminal CK of the odd numbered stages, and the second clock signal CKVB may be applied to the clock input terminal CK of the even numbered stages.

Figure 5:
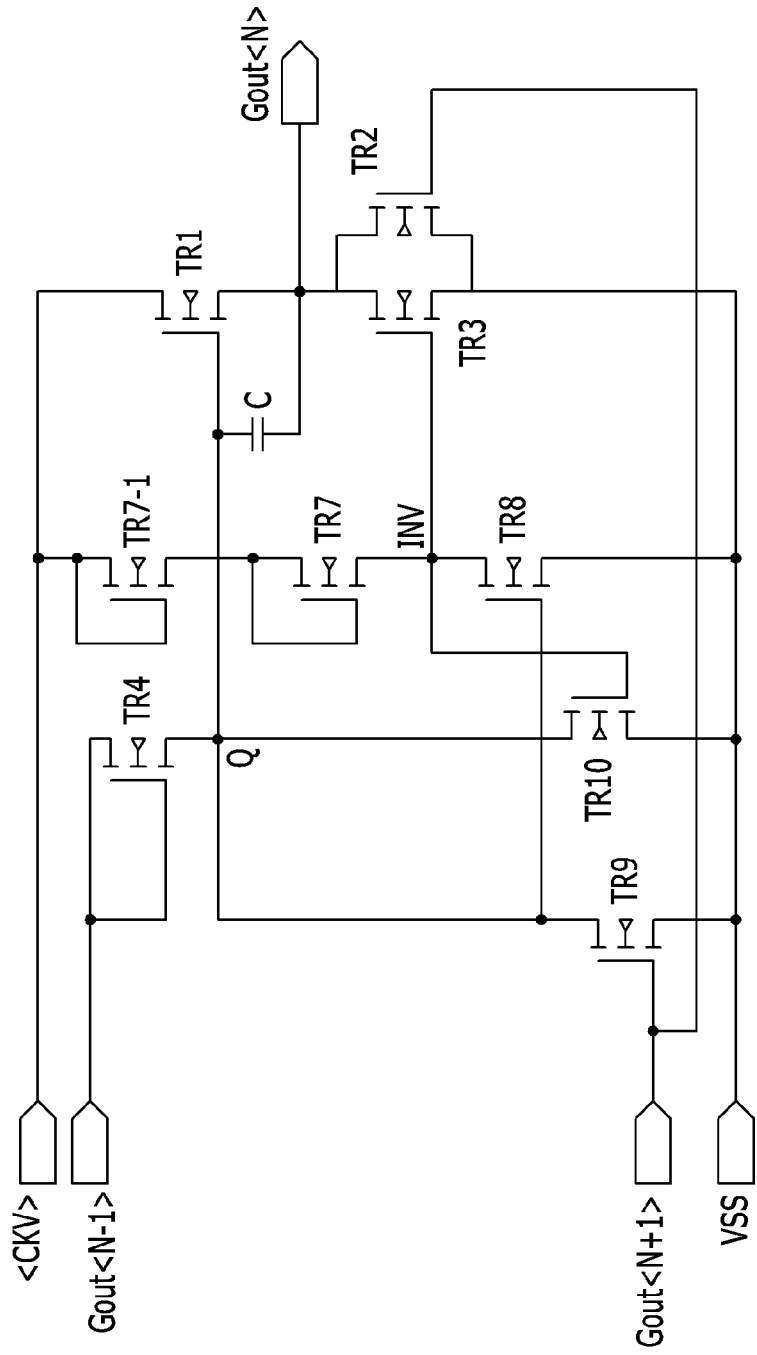
FIG. 5 is a circuit diagram of a stage in a gate driver according to a second exemplary embodiment of the inventive concept.

Next, the stage of the gate driver according to a second exemplary embodiment of the inventive concept will be described with reference to FIG. 5. FIG. 5 is a circuit diagram of the stage in the gate driver according to the second exemplary embodiment. The second exemplary embodiment is similar to the first exemplary embodiment, except the second exemplary embodiment of FIG. 5 further includes a (7-1)-th transistor TR7-1. The same reference numerals are used to describe similar elements, and therefore a detailed description of the similar elements will be omitted.

Referring to FIG. 5, the stage SRn includes the first transistor TR1, the second transistor TR2, the third transistor TR3, the fourth transistor TR4, the seventh transistor TR7, the (7-1)-th transistor TR(7-1), the eighth transistor TR8, the ninth transistor TR9, the tenth transistor TR10, and the capacitor C.

The input terminal and the control terminal of the (7-1)-th transistor TR(7-1) are connected to the clock input terminal CK, and the output terminal of the (7-1)-th transistor TR(7-1) is connected to the input and output terminals of the seventh transistor TR7. Accordingly, the (7-1)-th transistor TR(7-1) and the seventh transistor TR7 are coupled in series such that a DC stress of the INV node is decreased.

The gate driver according to the second exemplary embodiment of FIG. 5 operates in a manner similar to the gate driver according to the first exemplary embodiment of FIG. 3. As such, a detailed description of the operation of the gate driver according to the second exemplary embodiment will be omitted.

Figure 6:
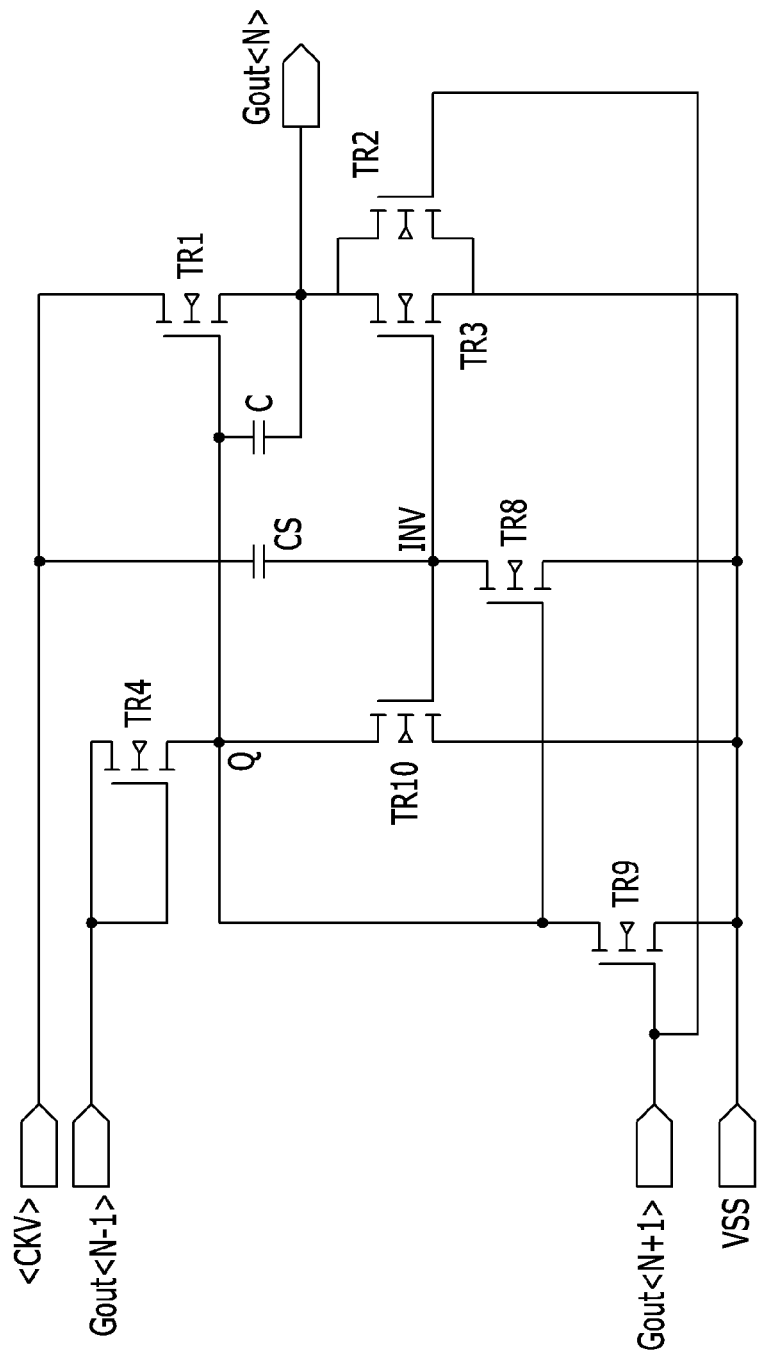
FIG. 6 is a circuit diagram of a stage in a gate driver according to a third exemplary embodiment of the inventive concept.

Next, the stage of the gate driver according to a third exemplary embodiment of the inventive concept will be described with reference to FIG. 6. FIG. 6 is a circuit diagram of the stage in the gate driver according to the third exemplary embodiment. The third exemplary embodiment of FIG. 6 is similar to the first exemplary embodiment of FIG. 3, except the third exemplary embodiment has a capacitor Cs in place of the seventh transistor TR7. The same reference numerals are used to describe similar elements, and therefore a detailed description of the similar elements will be omitted.

Referring to FIG. 6, the stage SRn includes the first transistor TR1, the second transistor TR2, the third transistor TR3, the fourth transistor TR4, the eighth transistor TR8, the ninth transistor TR9, the tenth transistor TR10, the capacitor C, and the capacitor Cs. The capacitor Cs includes a terminal connected to the clock input terminal CK and another terminal connected to the INV node. Accordingly, the clock input terminal CK and the INV node are coupled such that the voltage of the INV node is changed according to the signal CKV. The gate driver according to the third exemplary embodiment of FIG. 6 operates in a manner similar to the gate driver according to the first exemplary embodiment of FIG. 3. As such, a detailed description of the operation of the gate driver according to the third exemplary embodiment will be omitted.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
a display unit including a plurality of gate lines and a gate driver, wherein the gate driver includes a plurality of stages configured to output a gate signal to a corresponding gate line from among the plurality of gate lines,
wherein the gate driver further includes:
a first transistor including an input terminal to which a clock signal is applied and a control terminal connected to a first node;
a first capacitor including a terminal connected to the first node and another terminal connected to an output terminal of the first transistor;
a second transistor including an input terminal connected to the output terminal of the first transistor, a control terminal connected to a second node, and an output terminal to which a low voltage is applied;
a third transistor including an output terminal connected to the second node, a control terminal connected to the first node, and an input terminal to which the low voltage is applied;
a fourth transistor including an input terminal connected to the first node and an output terminal to which the low voltage is applied;
a fifth transistor, wherein an input terminal and a control terminal of the fifth transistor are connected and applied with an output signal of a previous stage or a scan start signal, and wherein an output terminal of the fifth transistor is connected to the first node;
a sixth transistor including an input terminal connected to the first node, a control terminal connected to the second node, and an output terminal to which the low voltage is applied; and
a seventh transistor including an input terminal and a control terminal to which the clock signal is applied, and an output terminal connected to the second node,
wherein a voltage at the first node increases from the low voltage to a high voltage while the first capacitor is charged, according to an output signal of a previous stage,
wherein the voltage at the first node is boosted up from the high voltage to a boosted up voltage by the first capacitor according to an output signal of a current stage, and a voltage of the second node is changed to the low voltage according to the boosted up voltage that is applied to the control terminal of the third transistor,
wherein the fourth transistor is switched according to an output signal of a next stage, and the voltage at the first node is decreased from the boosted up voltage to the low voltage through the fourth transistor,
wherein the first capacitor is precharged by the output signal of the previous stage or the scan start signal at a first time, and
wherein the first capacitor is boosted up by a high level of the clock signal at a second time that is subsequent to the first time.

2. The display device of claim 1, wherein the fifth transistor is diode-connected according to the output signal of the previous stage or the scan start signal.

3. The display device of claim 1, wherein the sixth transistor is switched according to a voltage of the second node.

4. The display device of claim 1, wherein the seventh transistor is diode-connected according to the clock signal.

5. The display device of claim 1, further comprising:
an eighth transistor including an input terminal connected to the output terminal of the first transistor, a control terminal connected to the control terminal of the fourth transistor, and an output terminal to which the low voltage is applied,
wherein the eighth transistor is switched according to the output signal of the next stage.

6. The display device of claim 5, further comprising:
a ninth transistor including an input terminal and a control terminal to which the clock signal is applied, and an output terminal connected to the input terminal of the seventh transistor, and wherein the ninth transistor is diode-connected according to the clock signal.

7. A gate driving circuit comprising:
a plurality of stages configured to output a gate signal to a corresponding gate line,
wherein one of the plurality of stages includes:
a first transistor including an input terminal to which a clock signal is applied and a control terminal connected to a first node;
a first capacitor including a terminal connected to the first node and another terminal connected to an output terminal of the first transistor;
a second transistor including an input terminal connected to the output terminal of the first transistor, a control terminal connected to a second node, and an output terminal to which a low voltage is applied;
a third transistor including an output terminal connected to the second node, a control terminal connected to the first node, and an input terminal to which the low voltage is applied;

a fourth transistor including an input terminal connected to the first node and an output terminal to which the low voltage is applied;

a fifth transistor, wherein an input terminal and a control terminal of the fifth transistor are connected and applied with an output signal of a previous stage or a scan start signal, and wherein an output terminal of the fifth transistor is connected to the first node:

a sixth transistor including an input terminal connected to the first node, a control terminal connected to the second node, and an output terminal to which the low voltage is applied; and a seventh transistor including an input terminal and a control terminal to which the clock signal is applied, and an output terminal connected to the second node, wherein a voltage at the first node increases from the low voltage to a high voltage while the first capacitor is charged, according to an output signal of a previous stage, wherein the voltage at the first node is boosted up from the high voltage to a boosted up voltage by the first capacitor according to an output signal of a current stage, and a voltage of the second node is changed to the low voltage according to the boosted up voltage that is applied to the control terminal of the third transistor, wherein the fourth transistor is switched according to an output signal of a next stage, and the voltage at the first node is decreased from the boosted up voltage to the low voltage through the fourth transistor, wherein the first capacitor is precharged by the output signal of the previous stage or the scan start signal at a first time, and wherein the first capacitor is boosted up by a high level of the clock signal at a second time that is subsequent to the first time.

8. The gate driving circuit of claim 7, wherein the fifth transistor is diode-connected according to the output signal of the previous stage or the scan start signal.

9. The gate driving circuit of claim 7, wherein the sixth transistor is switched according to a voltage of the second node.

10. The gate driving circuit of claim 7, wherein the seventh transistor is diode-connected according to the clock signal.

11. The gate driving circuit of claim 7, further comprising:

an eighth transistor including an input terminal connected to the output terminal of the first transistor, a control terminal connected to the control terminal of the fourth transistor, and an output terminal to which the low voltage is applied, wherein the eighth transistor is switched according to the output signal of the next stage.

12. The gate driving circuit of claim 11, further comprising:

a ninth transistor including an input terminal and a control terminal to which the clock signal is applied, and an output terminal connected to the input terminal of the seventh transistor, and wherein the ninth transistor is diode-connected according to the clock signal.

* * * * *